United States Patent
Akaike et al.

(10) Patent No.: US 8,536,952 B2
(45) Date of Patent: Sep. 17, 2013

(54) OSCILLATION DEVICE

(75) Inventors: Kazuo Akaike, Sayama (JP); Kaoru Kobayashi, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 45 days.

(21) Appl. No.: 13/406,694

(22) Filed: Feb. 28, 2012

(65) Prior Publication Data
US 2012/0218048 A1  Aug. 30, 2012

(30) Foreign Application Priority Data

Feb. 28, 2011  (JP) ................................ 2011-042886

(51) Int. Cl.
*H03B 5/32* (2006.01)
(52) U.S. Cl.
USPC ... 331/158; 331/176; 331/116 R; 331/116 FE
(58) Field of Classification Search
USPC ................. 331/158, 176, 116 R, 116 FE
See application file for complete search history.

(56) References Cited

U.S. PATENT DOCUMENTS

| | | | |
|---|---|---|---|
| 5,122,763 A * | 6/1992 | Saeki et al. | 331/2 |
| 6,166,608 A | 12/2000 | Merriss et al. | |
| 6,831,525 B1 * | 12/2004 | Beaudin et al. | 331/176 |
| 7,541,878 B2 * | 6/2009 | Haiut | 331/2 |
| 2009/0278616 A1 | 11/2009 | Nicholls et al. | |
| 2012/0194277 A1 * | 8/2012 | Akaike et al. | 331/2 |
| 2012/0194280 A1 * | 8/2012 | Akaike et al. | 331/48 |

FOREIGN PATENT DOCUMENTS

JP  2001-292030  10/2001

OTHER PUBLICATIONS

Apr. 13, 2010, XP55027325, Retrieved from the Internet: URL:http://www.congrex.nl/EFTF_Proceedings/Papers/Poster 1/P109_Stofanik.pdf [retrieved on May 15, 2012] *the whole document*.

* cited by examiner

*Primary Examiner* — Arnold Kinkead
(74) *Attorney, Agent, or Firm* — Jordan and Hamburg LLP

(57) ABSTRACT

Provided is an oscillation device capable of obtaining a stable oscillation frequency by compensating for a change in oscillation frequency caused with an elapse of operating time of a quartz-crystal oscillator. A difference value ΔF between a frequency difference between first and second quartz-crystal oscillators after a predetermined period of time has elapsed from a reference time and a frequency difference between the first and second quartz-crystal oscillators at the reference time is determined.

6 Claims, 17 Drawing Sheets

(a)

(b)

(a) OUTPUT OF DDS, LATCH POINT (b) OUTPUT OF LATCH (c) OUTPUT OF LOOP FILTER (a) OUTPUT OF DDS, LATCH POINT (b) OUTPUT OF LATCH (c) OUTPUT OF LOOP FILTER (a)

(b)

OSCILLATION DEVICE

BACKGROUND OF THE INVENTION

1. Field of the Invention

The present invention is an oscillation device using a quartz-crystal oscillator, and relates to a technique for compensating for aging in frequency of the quartz-crystal oscillator.

2. Description of the Related Art

A quartz-crystal oscillator has a property that a drift of oscillation frequency occurs with an elapse of driving time. Meanwhile, in the marketplace, an application in which quite high frequency stability is required to a quartz-crystal oscillator has been increasing, and normally, an OCXO is generally applied as the quartz-crystal oscillator when being incorporated in the application. The OCXO has an advantage that the drift is small, but, it is formed of a large-scale device and thus has a large power consumption. For this reason, it is considered to use a TCXO with a simple structure and small power consumption, but, the TCXO has a disadvantage that a drift amount of oscillation frequency with an elapse of driving time is large, and thus has a problem that it is difficult to be applied to an application to which high frequency stability is required.

Although Patent Document 1 describes a technique in which two quartz-crystal oscillators (quartz-crystal resonators) are structured by providing two pairs of electrodes on a common quartz-crystal piece, and by utilizing an appearance of frequency difference between the two quartz-crystal oscillators in accordance with a temperature change, a temperature compensation of oscillation frequency is conducted, it does not describe about a compensation of aging in frequency.

[Patent Document 1] Japanese Patent Application Laid-open No. 2001-292030

SUMMARY OF THE INVENTION

The present invention has been made under such circumstances, and an object thereof is to provide an oscillation device capable of obtaining a stable oscillation frequency by compensating for a change in oscillation frequency caused with an elapse of operating time of a quartz-crystal oscillator.

The present invention is characterized to be structured such that, in an oscillation device using quartz-crystal oscillators, there are provided: a first quartz-crystal oscillator structured by providing first electrodes on a quartz-crystal piece; a second quartz-crystal oscillator structured by providing second electrodes on a quart-crystal piece; a first oscillation circuit and a second oscillation circuit connected to these first quartz-crystal oscillator and second quartz-crystal oscillator, respectively; a frequency difference detecting unit determining, when an oscillation frequency of the first oscillation circuit is set to f1, an oscillation frequency of the first oscillation circuit at a reference time is set to f1$rz$, an oscillation frequency of the second oscillation circuit is set to f2, and an oscillation frequency of the second oscillation circuit at the reference time is set to f2$rz$, a value corresponding to a difference value $\Delta F$ between a value corresponding to a difference between f2 and f2$rz$, and a value corresponding to a difference between f1 and f1$rz$; and a compensation value obtaining unit for aging compensation obtaining a frequency compensation value of f1 based on an elapse of time from the reference time, based on the value corresponding to the difference value $\Delta F$ detected by the frequency difference detecting unit, and a compensation coefficient of aging, in which the compensation coefficient of aging is a ratio between an amount of change in the frequency of the first oscillation circuit and an amount of change in the frequency of the second oscillation circuit with respect to an elapse of operating time from the reference time, an output of the oscillation device is generated by utilizing an output of the first oscillation circuit, and a set value of the output frequency is compensated based on the frequency compensation value determined by the compensation value obtaining unit.

Concrete structural examples of the present invention will be enumerated.

The oscillation frequency f1 of the first oscillation circuit is an n-th overtone, the oscillation frequency f2 of the second oscillation circuit is a frequency of fundamental wave, and the difference value $\Delta F$ is $\{(f2-f2rz)/f2rz\}-\{(f1-f1rz)/f1rz\}$.

Further, an another concrete example is characterized in that the compensation coefficient of aging is a value set at a reference temperature, and that it includes: a temperature detecting unit detecting an atmospheric temperature under which the first quartz-crystal oscillator and the second quartz-crystal oscillator are placed; and a calculating unit for temperature compensation determining, based on a relation between an amount of temperature change from the reference temperature and an amount of variation with respect to the difference value $\Delta F$ at the reference temperature, and the atmospheric temperature determined by the temperature detecting unit, an amount of change due to the temperature change included in the difference value $\Delta F$ at the reference time, in which the compensation value obtaining unit obtains the frequency compensation value of f1 by using a value obtained by subtracting the amount of change calculated by the calculating unit for temperature compensation from the difference value $\Delta F$.

A still another concrete example is characterized in that it includes: a temperature detecting unit detecting an atmospheric temperature under which the first quartz-crystal oscillator and the second quartz-crystal oscillator are placed; and a compensation value obtaining unit for temperature compensation obtaining, based on a signal corresponding to the temperature detected by the temperature detecting unit, and a relation between the signal and a frequency compensation value of the oscillation frequency f1 of the first oscillation circuit, the frequency compensation value of f1 because the ambient temperature is deviated from the reference temperature, in which it is structured such that a set value of the output frequency is compensated based on the frequency compensation value determined by the compensation value obtaining unit for aging compensation, and the frequency compensation value determined by the compensation value obtaining unit for temperature compensation.

The frequency difference detecting unit is characterized in that it includes: a pulse creating section creating a pulse of difference frequency between the f1 and f2; a DDS circuit section outputting a frequency signal whose signal value repeatedly increases and decreases with time by a frequency in accordance with a magnitude of an input direct-current voltage; a latch circuit latching, based on the pulse created by the pulse creating section, the frequency signal output from the DDS circuit section; a loop filter integrating a value of the signal latched by the latch circuit and outputting the integral value as a value corresponding to the difference value; and an adding section obtaining a difference between the output of the loop filter and a value corresponding to a difference between f1$rz$ and f2$rz$ to set it as an input value to be input into the DDS circuit section.

It is characterized in that the quartz-crystal piece of the first quartz-crystal oscillator and the quartz-crystal piece of the second quartz-crystal oscillator are made common.

In the present invention, when the oscillation frequency of the first oscillation circuit is set to f1, the oscillation frequency of the first oscillation circuit at the reference time is set to f1rz, the oscillation frequency of the second oscillation circuit is set to f2, and the oscillation frequency of the second oscillation circuit at the reference time is set to f2rz, the value corresponding to the difference value ΔF between the value corresponding to the difference between f2 and f2rz and the value corresponding to the difference between f1 and f1rz (namely, the difference value ΔF between the amount of change in the frequency in the first quartz-crystal oscillator from the reference time and the amount of change in the frequency in the second quartz-crystal oscillator from the reference time) is determined. Further, when the ratio between the amount of change in the frequency of the first quartz-crystal oscillator and the amount of change in the frequency of the second quartz-crystal oscillator with respect to the elapse of time from the reference time is treated as constant, the ratio is set to the compensation coefficient of aging, and the compensation value of the frequency of the quartz-crystal oscillator for producing the output of the oscillation device is obtained based on the value corresponding to the difference value ΔF and the compensation coefficient of aging. Therefore, since the change in the oscillation frequency with the elapse of operating time of the quartz-crystal oscillator is compensated, a stable oscillation frequency is obtained.

DETAILED DESCRIPTION OF THE PREFERRED EMBODIMENT(S)

[Outline of Embodiment of the Invention]

In an oscillation device according to this embodiment, in a case where an oscillation output of a first oscillation circuit that oscillates a first quartz-crystal oscillator is used as a clock of a control circuit, for example, if a clock frequency changes due to aging of the first quartz-crystal oscillator, an operation of the control circuit is deviated from an intended operation. For this reason, there is provided a technique for compensating for an amount of aging in the clock frequency (amount of change in frequency due to aging). Before explaining the embodiment in detail, an outline of a state of the compensation will be quite schematically described. Numerical values used in this schematic explanation are for the sake of convenience, and an inclination of graph and the like are also for the sake of convenience.

Now, if it is assumed that a third overtone of a first quartz-crystal oscillator (frequency is set to f1) is used as a clock, and t0 is set as a reference time, aging in frequency of 1/3 of the third overtone is represented by a graph on a lower side in FIG. 1(a), and f1/3 at the reference time t0 is 900 Hz. What is wanted to be known in this embodiment is how much of f1 is changed from a frequency at the reference time when a certain number of days have elapsed after the use of oscillation device (after the driving of the quartz-crystal oscillator), for example. Accordingly, a second quartz-crystal oscillator different from the first quartz-crystal oscillator is used, and a fundamental wave of the quartz-crystal oscillator (frequency is f2) is utilized. Aging in the frequency of fundamental wave is greater than aging in the frequency of overtone, and further, a ratio between the both aging in the frequencies is constant.

This embodiment focuses attention on this point. A graph on an upper side in FIG. 1(a) represents the aging in the frequency f2 of fundamental wave, and f2 at the reference time t0 is 1000 Hz. FIG. 1(b) represents the aging in the both frequencies under the aligned reference time t0, and a height from a horizontal axis of each graph indicates an amount of change in the frequency. Specifically, when a frequency of overtone at the reference time is set to f1re, an amount of change in the frequency of third overtone corresponds to a difference (f1−f1re)/3 between f1re/3 and f1/3 at a certain point of time. Further, when a frequency at the reference time is set to f2re, an amount of change in the frequency of fundamental wave corresponds to a difference (f2−f2re) between f2re and f2 at a certain point of time.

Figure 1:
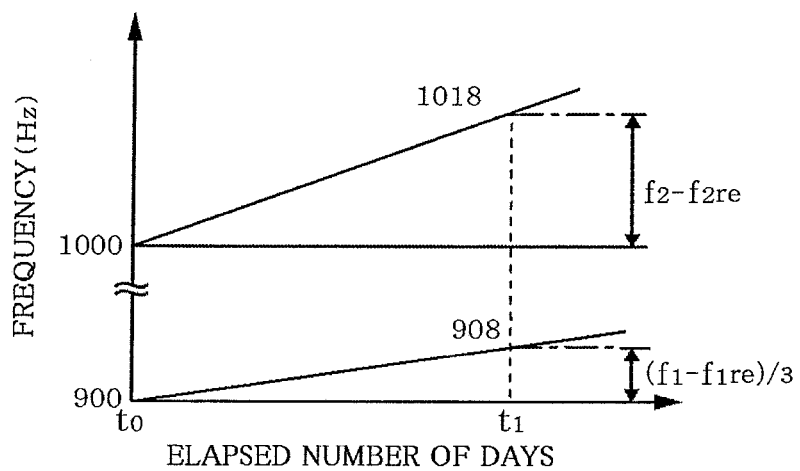
FIGS. 1(a) and 1(b) are schematic explanatory diagrams showing aging in oscillation frequencies used for explanation of an outline of an embodiment of the present invention.
Figure 1:
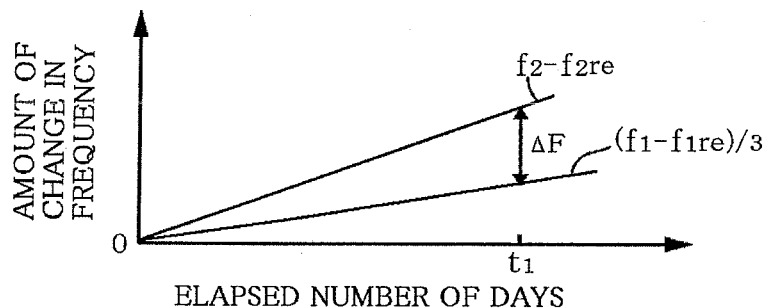

A measuring object is a difference frequency between f1/3 and f2, and since respective frequencies f1re/3, f2re at the reference time are known (900 Hz and 1000 Hz, in this example), when a measured value of f2−f1/3 becomes known, a value of (f2−f2re)−(f1−f1re)/3=ΔF (refer to FIG. 1(b)) becomes known. Further, a ratio m of (f1−f1re)/3 to (f2−f2re) is treated as constant at respective points of time, and since the ratio is previously known, if ΔF becomes known, it is possible to determine a value [(f1−f1re)/3] being 1/3 of an amount of aging compensation in f1 which is tried to be determined conclusively. In an example of FIG. 1, the ratio m is 4/9, so that if ΔF being a measured result at a time t1 is 10 Hz, 8 Hz is obtained from an expression of (f1−f1re)/3=ΔF·m/(1−m).

Note that at an early stage where a current is made to flow through the quartz-crystal oscillator for the first time after the oscillator is manufactured, a relation between an elapsed time and the amount of change in frequency is nonlinear, so that a timing after the relation becomes linear, which is, for example, a timing immediately before the shipment from a manufacturer, is set to the reference time.

Therefore, the frequency f1 of third overtone being the clock in the first quartz-crystal oscillator is increased by 24 Hz from 2700 Hz, and regarding an operation of the control circuit, there is performed a control to cancel an amount of increase of 24 Hz, which is a control of control voltage or the like, for example. Incidentally, the above-mentioned explanation is applied to a case where an ambient temperature determining frequency characteristics and an ambient temperature at the time t1 shown in FIG. 1 are set to be equal. If the ambient temperature determining the frequency characteristics is, for example, 25° C. being a reference temperature, and the ambient temperature at the time t1 is 27° C., ΔF also includes an amount of change in frequency due to a temperature variation. In that case, it is not possible to correctly determine an amount of variation based on the aging in f1.

Therefore, in this embodiment, the first quartz-crystal oscillator and the second quartz-crystal oscillator are placed under the same ambient temperature, as will be described later, and a temperature detecting unit measuring the ambient temperature is used. Further, a relation between a normalized temperature normalized by the reference temperature (temperature when the reference temperature is set to zero) and ΔF at the reference time is previously determined, and based on the relation and a temperature detection value detected by the temperature detecting unit, an amount of variation in frequency difference based on a temperature change included in ΔF (temperature variation amount cancelling data when performing aging compensation) is determined. Concretely, if it is set that the characteristics in FIG. 1 are characteristics at the reference temperature, and frequencies of the first quartz-crystal oscillator and the second quartz-crystal oscillator at 27° C. at the reference time are 1003 Hz and 901 Hz, respectively, a characteristic of f2 and a characteristic of f1/3 are represented at positions higher than those in the graphs shown in FIG. 1 by 3 Hz and 1 Hz, respectively. Therefore, in the first place, a difference between f2re and f1re/3 is 2 Hz, not zero, at the reference time, and thus the aforementioned ΔF includes as much as 2 Hz based on the temperature change, in addition to the frequency difference based on the aging. For this reason, there is a need to apply an expression (1) by using a value as a result of subtracting 2 Hz from the measured ΔF.

$$(f1-f1re)/3=\Delta F\cdot m/(1-m) \quad (1)$$

The value of (f1−f1re)/3 obtained as above is, a sort of true amount of variation in frequency based on the aging included in f1/3, and by compensating for an output frequency of the first oscillation circuit by a value three times the value of (f1−f1re)/3, the amount of variation in frequency based on the aging in the output frequency of the first oscillation circuit is compensated.

Incidentally, when the temperature environment under which the quartz-crystal oscillators are placed varies, it is preferable to detect a temperature using a temperature detecting unit, and to determine an amount of variation in frequency based on a temperature change included in the frequency of the first quartz-crystal oscillator based on a relation previously determined with respect to the temperature (temperature normalized with respect to the reference temperature, for example) and the frequency of the first quartz-crystal oscillator (frequency normalized with respect to the frequency at the reference temperature, for example) and a temperature detection value. In this case, by subtracting the aforementioned amount of variation in frequency based on the aging and the amount of variation in frequency based on the temperature change from the frequency of the first quartz-crystal oscillator (by performing addition, depending on a sign of the value of the amount of variation), an intended output frequency can be stably obtained.

The compensation of frequency as described above includes not only a performance of direct compensation on the frequency of the first quartz-crystal oscillator but also an adjustment of control voltage to cancel the amount of variation in frequency in the control circuit that uses the frequency of the first quartz-crystal oscillator as the clock and the like, for example.

Note that the compensation of the amount of variation in frequency based on the aging in the present invention can also be applied to an OCXO.

[Detailed Explanation of Embodiment of the Invention]

Figure 2:
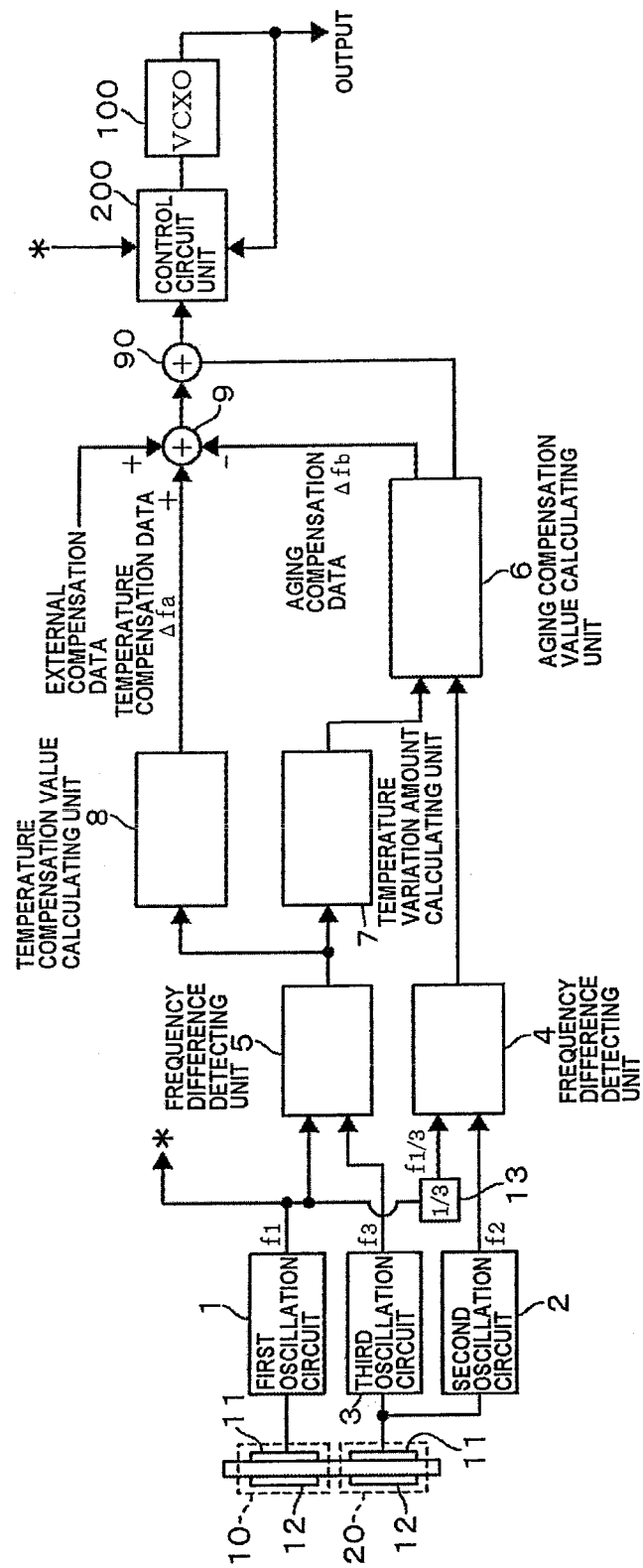
FIG. 2 is a block diagram showing an entire structure of an embodiment of the present invention.

Next, concrete circuitry, frequency characteristics and the like of the embodiment of the present invention will be described. FIG. 2 is a block diagram showing an entire embodiment of the oscillation device of the present invention. This oscillation device is structured as a frequency synthesizer that outputs a frequency signal of a set frequency, and includes a voltage controlled oscillator 100 using a quartz-crystal oscillator, a control circuit unit 200 that structures a PLL in the voltage controlled oscillator 100, and a signal compensation unit that performs temperature compensation and aging compensation of reference clock input into the control circuit unit 200. Although a reference numeral is not given to the signal compensation unit, the unit corresponds to a part on the left side of the control circuit unit 200 in FIG. 2.

Figure 3:
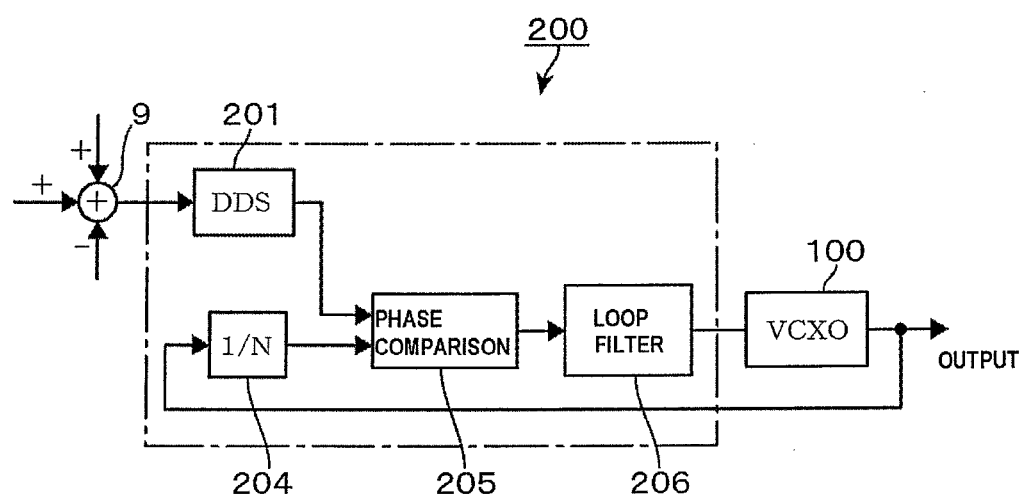
FIG. 3 is a block diagram showing a structure of a control circuit unit used in the above-described embodiment.

As shown in FIG. 3, the control circuit unit 200 compares, in a phase frequency comparison section 205, a phase of reference clock output from a DDS (Direct Digital Synthesizer) circuit section 201 with a phase of clock as a result of frequency-dividing an output of the voltage controlled oscillator 100 in a frequency divider 204, and a phase difference being a result of the comparison is analog-converted by a not-shown charge pump. The analog-converted signal is input into a loop filter 206 and controlled so that a PLL (Phase locked loop) is stabilized. Therefore, it is also possible to say that the control circuit unit 200 is a PLL unit. Here, the DDS circuit section 201 uses a frequency signal output from a later-described first oscillation circuit 1 as the reference clock, and frequency data (digital value) for outputting a signal of intended frequency is input therein.

However, aging in frequency of the reference clock occurs, so that in order to cancel an amount of the aging, a signal corresponding to a later-described frequency compensation value is added, in an adding unit 90, to the frequency data input into the DDS circuit section 201. By compensating for the frequency data input into the DDS circuit section 201, the output frequency of the DDS circuit section 201 corresponding to an amount of variation due to aging based on an amount of variation in aging characteristic of the reference clock is cancelled, resulting in that a frequency of reference clock is stabilized with respect to the variation in aging, and accordingly, an output frequency from the voltage controlled oscillator 100 is stabilized.

Figure 10:
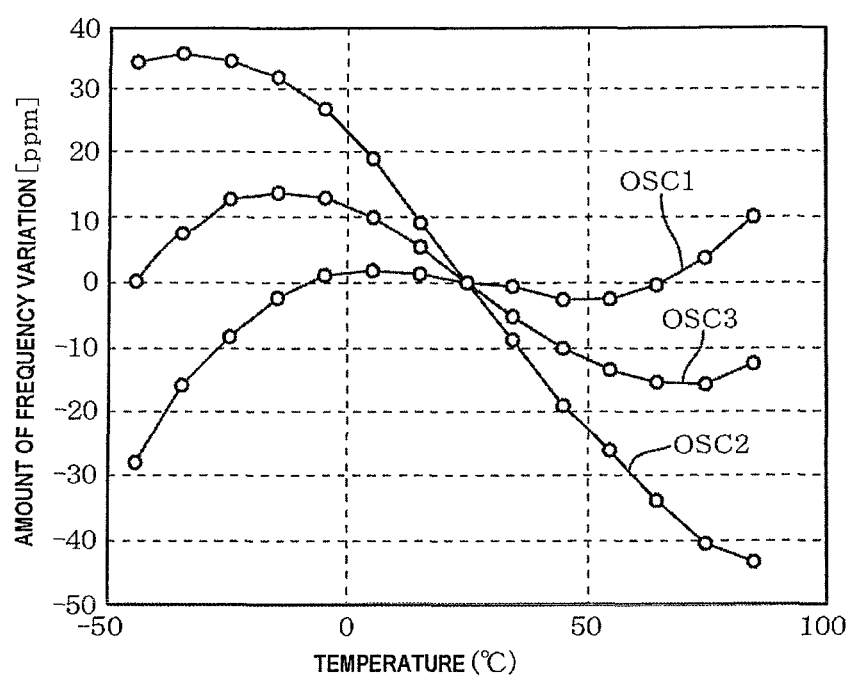
FIG. 10 is a frequency-temperature characteristic diagram showing is relations between a value of normalized frequency f1 and the temperature, between a value of normalized frequency f2 and the temperature, and between a value of normalized frequency f3 and the temperature.

The signal compensation unit includes an aging compensation section and a temperature compensation section. In FIGS. 2, 10 and 20 are a first quartz-crystal oscillator and a second quartz-crystal oscillator, respectively. These quartz-crystal oscillators 10 and 20 are structured by using a common quartz-crystal piece Xb. Specifically, for example, an area of the quartz-crystal piece Xb with a strip shape is divided into two in a longitudinal direction, and excitation electrodes are provided on both front and rear surfaces of the respective divided areas (oscillation areas). Therefore, a first divided area and a pair of electrodes 11, 12 form the first quartz-crystal oscillator 10, and a second divided area and a pair of electrodes 11, 12 form the second quartz-crystal oscillator 20. For this reason, it can be said that these quartz-crystal oscillators 10 and 20 are thermally coupled.

To the first quartz-crystal oscillator 10, a first oscillation circuit 1 is connected. In the first quartz-crystal oscillator 10, a fundamental wave of 28.2 MHz is used, and an output of the first oscillation circuit 1 is a third overtone (harmonic), for example. To the second quartz-crystal oscillator 20, a second oscillation circuit 2 and a third oscillation circuit 3 which are mutually insulated are connected. In the second quartz-crystal oscillator 20, a fundamental wave of 26.5 MHz is used. These second oscillation circuit 2 and third oscillation circuit 3 are structured such that a switch part, which is not illustrated, is provided at a branch point between input lines for securing mutual insulation, and when switching is made to one contact, the excitation electrodes of the second quartz-crystal oscillator 20 are connected to the second oscillation circuit 2, and when switching is made to the other contact, the excitation electrodes of the second quartz-crystal oscillator 20 are connected to the third oscillation circuit 3. Therefore, by performing alternate switching between the one contact and the other contact, a fundamental wave (f2) of the second quartz-crystal oscillator 20 and a third overtone (f3) of the second quartz-crystal oscillator 20 are obtained as time-division data from the second oscillation circuit 2 and the third oscillation circuit 3, respectively, and it is possible to perform post-stage signal processing.

Each of outputs of the first oscillation circuit 1 and the third oscillation circuit 3 may be an overtone other than the third overtone, or may also be a fundamental wave. When the output of overtone is obtained, it is also possible to design such that a tuning circuit for overtone is provided in an oscillation loop formed of a quartz-crystal oscillator and an amplifier, for example, and the oscillation loop is oscillated by the overtone. Alternatively, it is also possible to design such that the oscillation loop is oscillated by the fundamental wave, a class C amplifier is provided at a subsequent stage of an oscillation stage, namely, at a subsequent stage of an amplifier being a part of Colpitts circuit, for example, to distort the fundamental wave using the class C amplifier, and a tuning circuit tuned to the overtone is provided at a subsequent stage of the class C amplifier, thereby, resultingly, a third overtone oscillation frequency, for instance, is output from each of the oscillation circuits 1, 2.

Here, for convenience, if it is set such that a frequency signal of frequency f1 is output from the first oscillation circuit 1, a frequency signal of frequency f2 is output from the second oscillation circuit 2, and a frequency signal of frequency f3 is output from the third oscillation circuit 3, the frequency signal of the frequency f1 is supplied to the control circuit unit 200 as a reference clock. In the present invention, the frequency signal of the frequency f1 is utilized for an output of the oscillation device, in which, the term "utilized" means that the signal is used as a clock of the control circuit unit 200 shown in FIG. 2, in this example. However, the present invention is not limited to such an example, and also includes a case where, in an oscillation device combining a quartz-crystal oscillator being a general TCXO and an oscillation circuit oscillating the quartz-crystal oscillator, the first quartz-crystal oscillator and the first oscillation circuit correspond to these quartz-crystal oscillator and oscillation circuit, respectively, for example, and in this case, the frequency signal of the frequency f1 becomes is an output itself.

The frequency f1 and the frequency f2 respectively correspond to f1, f2 in the above-described explanation of the outline of the embodiment. Therefore, the first quartz-crystal oscillator 10 and the first oscillation circuit 1, and the second quartz-crystal oscillator 20 and the second oscillation circuit 2, are for measuring aging in the frequency f1 (state where the frequency f1 is changed from the frequency at the reference time caused by driving the first quartz-crystal oscillator 10).

Meanwhile, the first quartz-crystal oscillator 10 and the first oscillation circuit 1, and the third quartz-crystal oscillator 30 and the third oscillation circuit 3 serve as a part of the temperature detecting unit. Although this point will be described later, since there is a predetermined relation between a value corresponding to a difference between the frequencies f1 and f3 and the temperature, by measuring the difference, the temperature can be detected. Further, as one use of the temperature detection result, the result is used for detecting the temperature variation amount included in f2−f1/3 based on the temperature detection value, as described in the item of the explanation of the outline of the embodiment. Further, as an another use of the temperature detection result, the result is used for detecting the temperature variation amount included in the frequency f1 of the frequency signal output from the first oscillation circuit 1. Therefore, in this example, the frequency signal output from the first oscillation circuit 1 serves as a clock output part for driving the oscillation device, and in addition to that, it also serves to detect the temperature.

When explanation is returned to a part in which the aging in the frequency f1 is compensated, 4 in FIG. 2 is a frequency difference detecting unit. A frequency dividing circuit 13 having a frequency dividing ratio of 1/3 is provided between an output end of the first oscillation circuit 1 and an input end of the frequency difference detecting unit 4, and the frequency signal from the first oscillation circuit 1 whose frequency f1 is frequency-divided into 1/3, is input into the frequency difference detecting unit 4. The frequency difference detecting unit 4 is, schematically speaking, a circuit unit for obtaining $\Delta F = f2 - f1/3 - \Delta fre$, being a difference between a difference between f1/3 and f2, and $\Delta fre$. $\Delta fre$ is a difference between f2 (f2re) and f1/3 (f1re/3) at a reference temperature, which is, for example, 25° C., at a reference time.

The present invention is realized by calculating, with the use of the frequency difference detecting unit 4, $\Delta F$ being a difference between a value corresponding to the difference between f2 and f1/3 and a value corresponding to the difference between f2 and f1/3 at the reference temperature, which is, for example, 25° C. In a case of this embodiment (in a case of FIG. 4), more specifically speaking, a value obtained by the frequency difference detecting unit 4 is $\{(f2-f1/3)/(f1/3)\}-\{$ (f2re−f1re/3)/(f1re/3)}. However, a display of an output of the frequency difference detecting unit 4 is briefly described in the drawing.

This value corresponds to ΔF shown in FIG. 1. Specifically, as schematically described in the item of the outline of the embodiment of the invention, ΔF is a value for determining a compensation value for compensating for the aging in f1. Further, it is also possible to perform the compensation of aging in f1 also by using the value of {(f2−f1/3)/(f1/3)}−{(f2re−f1re/3)/(f1re/3)} instead of ΔF, and determining a compensation value by performing calculation of (f1−f1re)/3=ΔF·m/(1−m) as described above, by using the graph in FIG. 1(b), for example. The value obtained by the frequency difference detecting unit 4 is a 34-bit value, for example, and by compensating for the frequency data of the DDS circuit section 201 using this digital value, it is possible to achieve the same compensation operation as that in the above-described schematic explanation. Note that even when the frequency difference detecting unit 4 is a circuit unit that calculates ΔF=f2−f1/3−Δfre, there is no difference in that an effect of the present invention can be achieved.

Figure 4:
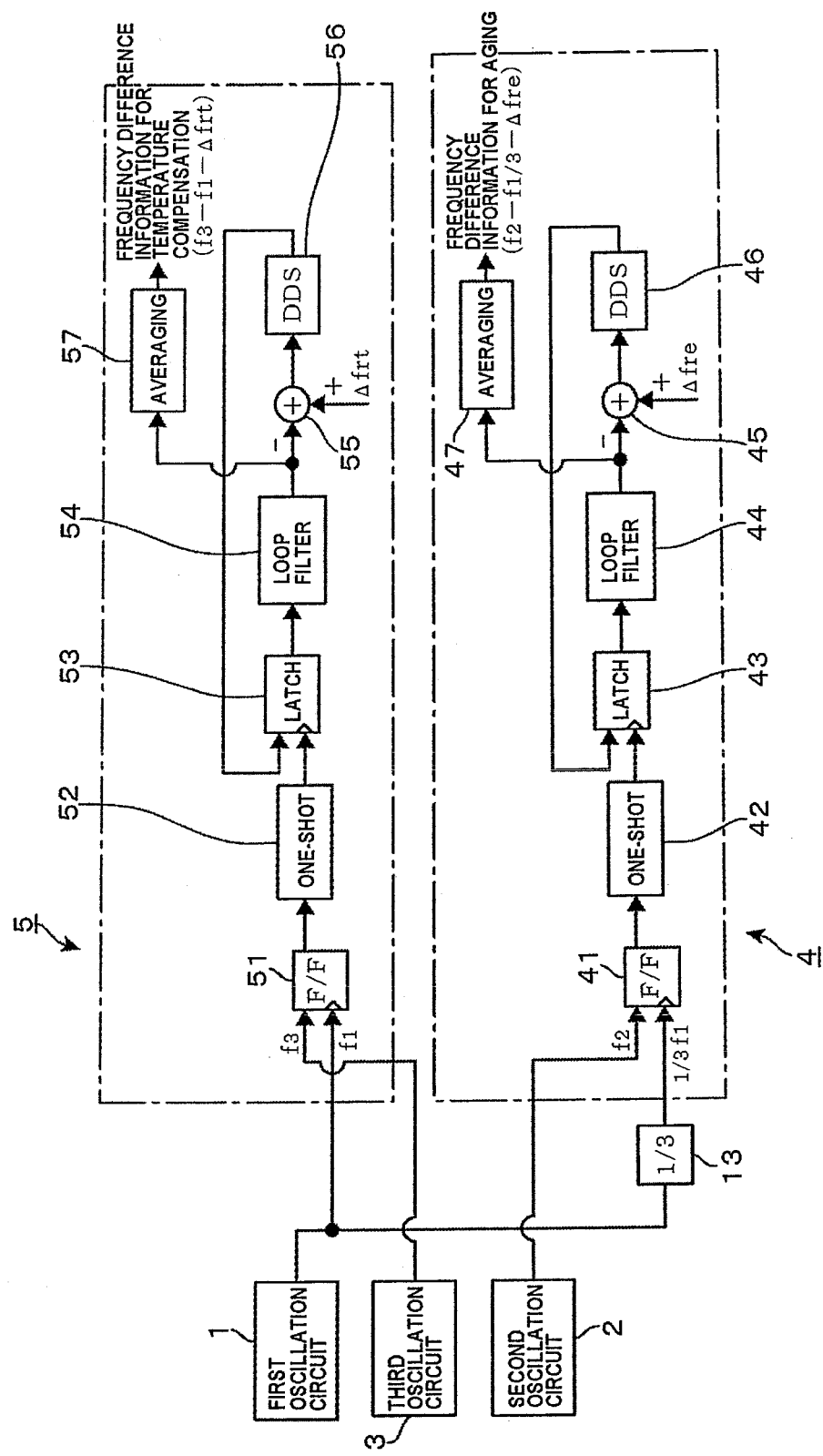
FIG. 4 is a block diagram showing frequency difference detecting units.
Figure 5:
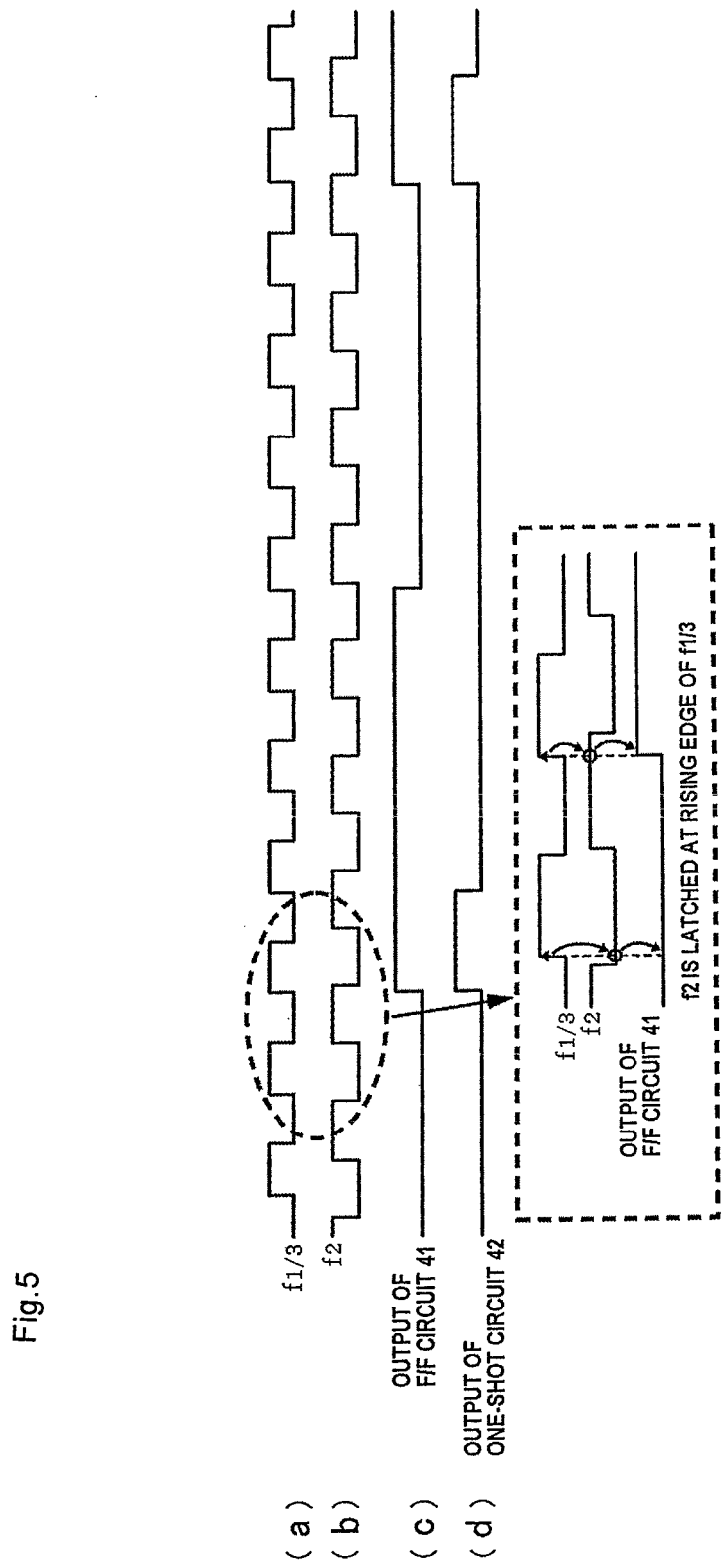
FIGS. 5(a), 5(b), 5(c) and 5(d) are waveform diagrams of some outputs of the frequency difference detecting unit.

FIG. 4 shows a concrete example of the frequency difference detecting unit 4. 41 denotes a flip-flop circuit (F/F circuit), in which the frequency signal of the frequency f1/3 from the first oscillation circuit 1 is input into one input end of the flip-flop circuit 41, and the frequency signal of the frequency f2 from the second oscillation circuit 2 is input into the other input end of the flip-flop circuit 41, and the flip-flop circuit 41 latches the frequency signal of the frequency f2 from the second oscillation circuit 2 based on the frequency signal of the frequency f1/3 from the first oscillation circuit 1. In the description hereinbelow, to avoid the redundancy of description, f1, f2 are treated such that they represent frequencies or frequency signals themselves. The flip-flop circuit 41 outputs a signal having a frequency of (f2−f1/3)/(f1/3), being the value corresponding to the frequency difference between f1/3 and f2.

A one-shot circuit 42 is provided at a subsequent stage of the flip-flop circuit 41, and the one-shot circuit 42 outputs a one-shot pulse at a rising edge of the pulse signal obtained from the flip-flop circuit 41. FIGS. 5(a) to 5(d) are time diagrams showing a series of signals described so far.

At a subsequent stage of the one-shot circuit 42, a PLL (Phase Locked Loop) is provided, and the PLL is structured by a latch circuit 43, a loop filter 44 having an integrating function, an adding section 45 and a DDS circuit section 46. The latch circuit 43 is for latching a saw-tooth wave output from the DDS circuit section 46, based on the pulse output from the one-shot circuit 42, and an output of the latch circuit 43 corresponds to a signal level of the saw-tooth wave at a timing at which the pulse is output. The loop filter 44 integrates a direct-current voltage being the signal level, and the adding section 45 adds the direct-current voltage and a direct-current voltage corresponding to Δfre. Data corresponding to the direct-current voltage corresponding to Δfre is stored in a not-shown memory.

Figure 6:
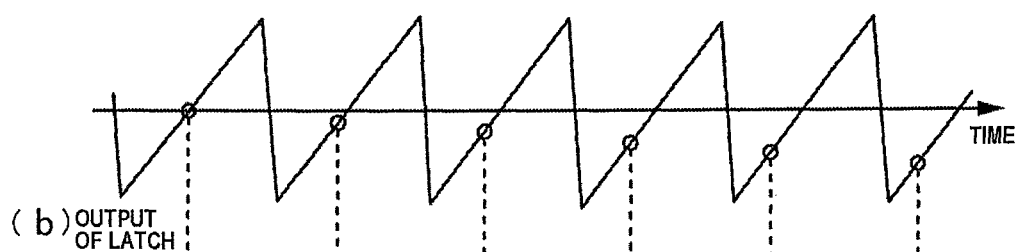
FIGS. 6(a), 6(b) and 6(c) are waveform diagrams of respective sections schematically showing an unlocked state in a loop including a DDS circuit section in the frequency difference detecting unit.
Figure 6:
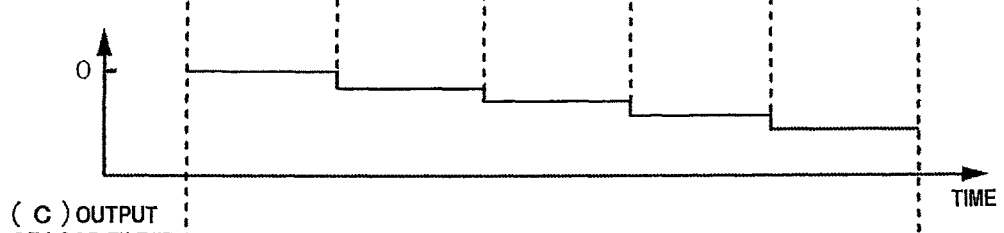
Figure 6:
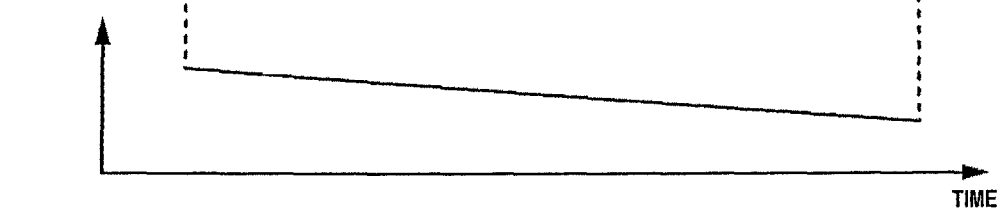

In this example, regarding a sign in the adding section 45, "+" is given to an input side of the direct-current voltage corresponding to Δfre, and "−" is given to an input side of the output voltage of the loop filter 44. To the DDS circuit section 46, a direct-current voltage calculated by the adding section 45, namely, a voltage as a result of subtracting the output voltage of the loop filter 44 from the direct-current voltage corresponding to Δfre is input, and a saw-tooth wave of a frequency in accordance with a value of the voltage is output from the DDS circuit section 46. For easier understanding of an operation of the PLL, states of outputs of the respective sections are quite schematically shown in FIG. 6. At a time of starting the device, the direct-current voltage corresponding to Δfre is input into the DDS circuit section 46 through the adding section 45, and, if Δfre is 5 MHz, for example, a saw-tooth wave of a frequency in accordance with the frequency is output from the DDS circuit section 46.

Figure 7:
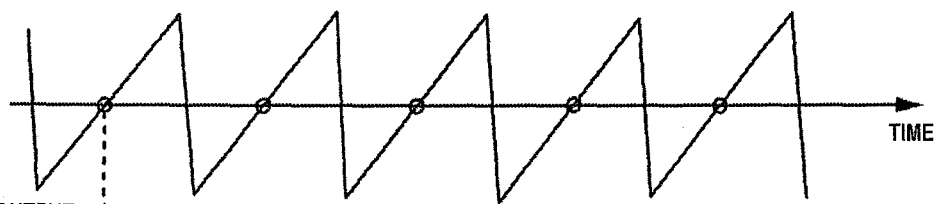
FIGS. 7(a), 7(b) and 7(c) are waveform diagrams of the respective sections schematically showing a locked state in the loop including the DDS circuit section in the frequency difference detecting unit.
Figure 7:
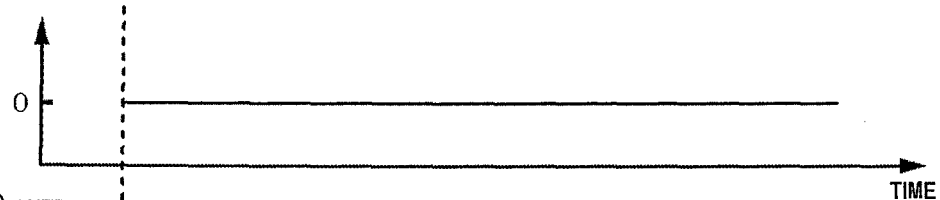
Figure 7:
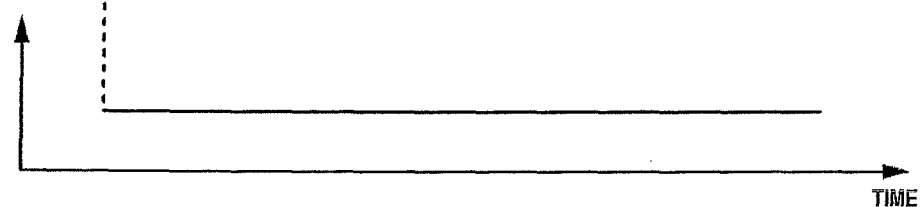

The saw-tooth wave is latched by the latch circuit 43 based on a pulse of frequency corresponding to (f2−f1/3), and, if (f2−f1/3) is 5.1 MHz, for example, a period of the pulse for latch is shorter than that of the saw-tooth wave, so that a latch point of the saw-tooth wave is gradually lowered as shown in FIG. 6(a), and the output of the latch circuit 43 and the output of the loop filter 44 are gradually lowered on the − side as shown in FIGS. 6(b) and 6(c). Since the sign in the adding section 45 on the output side of the loop filter 44 is "−", the direct-current voltage input into the DDS circuit section 46 from the adding section 45 increases. Accordingly, the frequency of the saw-tooth wave output from the DDS circuit section 46 becomes high, and when the direct-current voltage corresponding to 5.1 MHz is input into the DDS circuit section 46, the frequency of the saw-tooth wave becomes 5.1 MHz, and the PLL is locked as shown in FIGS. 7(a) to 7(c). The direct-current voltage output from the loop filter 44 at this time takes a value corresponding to Δfre−(f2−f1/3)=−0.1 MHz. Specifically, it can be said that an integral value of the loop filter 44 corresponds to an integral value of an amount of change of 0.1 MHz when the frequency of the saw-tooth wave is changed from 5 MHz to 5.1 MHz. Note that 5 MHz and 5.1 MHz are numerical values for the sake of convenience of explanation.

Here, as the frequency difference detecting unit, there is provided, in addition to the frequency difference detecting unit 4, a frequency difference detecting unit 5 as a part of function of performing temperature compensation, and for this reason, explanation regarding an operation when Δfre is larger than (f2−f1/3) will be made collectively, from the perspective that explanation of operation of the frequency difference detecting unit is supplemented. In this case, it is assumed that Δfre is 5.1 MHz, and (f2−f1/3) is 5 MHz, for example. Since the period of pulse for latch is longer than that of the saw-tooth wave, the latch point shown in FIG. 6(a) becomes gradually high, and in accordance with this, the output of the latch circuit 43 and the output of the loop filter 44 are also increased. Accordingly, since the value to be subtracted in the adding section 45 becomes large, the frequency of the saw-tooth wave is gradually lowered, and when the frequency soon reaches 5 MHz being the same frequency as that of (f2−f1/3), the PLL is locked. The direct-current voltage output from the loop filter 44 at this time takes a value corresponding to Δfre−(f2−f1/3)=0.1 MHz.

Figure 8:
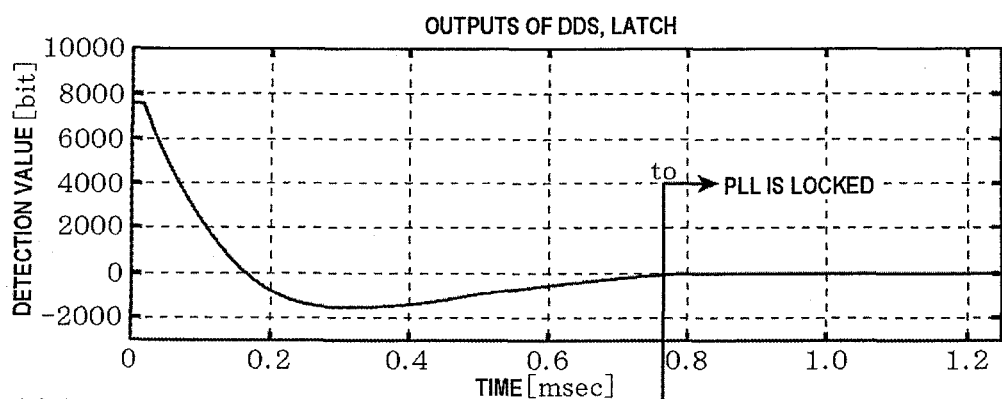
FIGS. 8(a) and 8(b) are output waveform diagrams of a loop filter in the loop in an actual device.
Figure 8:
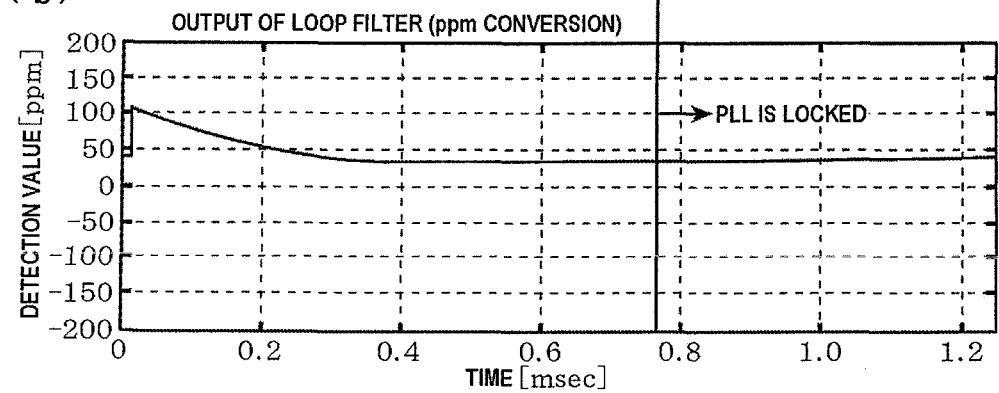

FIG. 8 show actual measured data, and in this example, the PLL is locked at a time t0. The output of the frequency difference detecting unit 4, namely, an output of an averaging circuit 47 shown in FIG. 4 is actually a value that represents the value of {(f2−f1/3)/(f1/3)}−{(f2re−f1re/3)/(f1re/3)} by a 34-bit digital value.

Further, since the operation of latching f2 based on f1/3 in the flip-flop circuit 41 is asynchronous, there is a possibility that an indefinite interval such as metastable (a state in which, when input data is latched at an edge of clock, the input data has to be held for a given period of time before and after the edge at which the latch is performed, but, the clock and the input data change at substantially the same time, so that an output becomes unstable) is generated, and thus an instantaneous error may be included in the output of the loop filter 44. In the aforementioned PLL, the output of the loop filter 44 is treated as the difference between Δfre and (f2−f1/3) being is the value corresponding to the temperature, so that by providing the averaging circuit 47 that determines a moving average of the input value at a previously set time, on an output side of the loop filter 44, even if the instantaneous error is generated, the error is removed. By providing the averaging circuit 47, it is possible to obtain, conclusively, frequency deviation information with high accuracy. The information obtained from the loop filter 44 of the PLL via the averaging circuit 47 is input into an aging compensation value calculating unit 6.

Next, explanation will be made on handling of the frequency f1 of the frequency signal from the first oscillation circuit 1 and the frequency f3 of the frequency signal from the third oscillation circuit 3. Note that it is set that each of the frequency signal from the third oscillation circuit 3 and the frequency of the signal is represented by f3. In FIG. 2, 5 is the frequency difference detecting unit, and the frequency difference detecting unit 5 is, schematically speaking, a circuit unit for obtaining $\Delta F'=f3-f1-\Delta frt$, being a difference between a difference between f1 and f3, and $\Delta frt$. Note that, if described more accurately, the frequency difference detecting unit 5 determines $\Delta F'$ which is $\{(f1-f1rt)/f1rt\}-\{(f3-f3rt)/f3rt\}$, similar to the frequency difference detecting unit 4.

$\Delta frt$ is a difference between f3 and f1 at the reference temperature, which is 25° C., for example. As shown in FIG. 4, the frequency difference detecting unit 5 has the same structure as that of the frequency difference detecting unit 4, and elements denoted by reference numerals 51 to 57 correspond to parts denoted by reference numerals 41 to 47, respectively. Note that it is also possible to set such that, when the aforementioned $\Delta F$ and $\Delta F'$ are determined, the common frequency difference detecting unit (4 or 5) is used, and calculation is performed by switching signals.

Frequency deviation information obtained by the frequency difference detecting unit 5, which is $\Delta frt-(f3-f1)$ in this example, corresponds to a temperature detection value. Specifically, $\Delta frt-(f3-f1)$ changes in accordance with the temperature, and further, $\Delta fre-(f2-f1/3)$ determined by the frequency difference detecting unit 4 also changes in accordance with the temperature. Therefore, $\Delta F$ and $\Delta F'$ obtained in the frequency difference detecting units 4, 5, respectively, are in a certain relation. Specifically, since $\Delta F$ varies based on a predetermined relation with respect to the temperature, by regarding $\Delta F'$ as the temperature detection value, a relation between $\Delta F$ and $\Delta F'$ is previously determined by setting the temperature as a medium, and the temperature variation amount included in $\Delta F$ is tried to be determined from the value of $\Delta F'$, as described in the outline of the embodiment. A part that performs this calculation is a temperature variation amount calculating unit 7.

Figure 9:
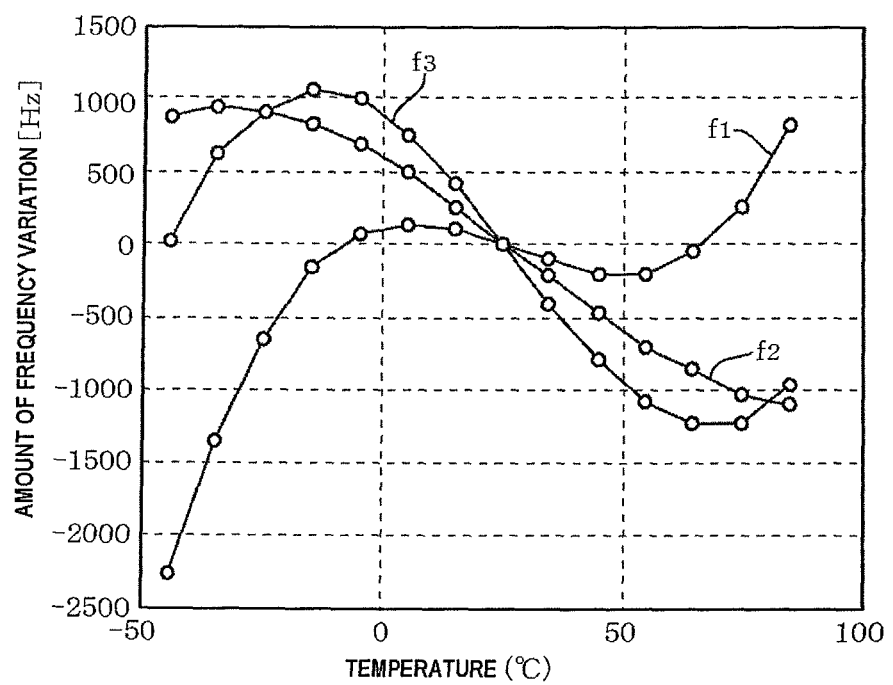
FIG. 9 is a frequency-temperature characteristic diagram showing relations between a frequency f1 of a first oscillation circuit and a temperature, between a frequency f2 of a second oscillation circuit and the temperature, and between a frequency f3 of a third oscillation circuit and the temperature.

Before making explanation on the temperature variation amount calculating unit 7, $\Delta F'$ and the temperature variation amount included in $\Delta F$ will be described with reference to FIG. 9 to FIG. 12. FIG. 9 is a characteristic diagram showing a relation between the temperature and the frequency after normalizing f1, f2 and f3 using the reference temperature. The normalization described here means to determine a relation between a deviation amount of frequency with respect to a frequency at a reference temperature and the temperature, by setting 25° C. to the reference temperature, for example, and setting, regarding the relation between the temperature and the frequency, the frequency at the reference temperature to zero. If the frequencies at 25° C. in the first to third oscillation circuits 1 to 3 are respectively set to f1r, f2r and f3r, namely, if the values of f1, f2, f3 at 25° C. are set to f1r, f2r, f3r, respectively, values on a vertical axis in FIG. 9 represent (f1−f1r), (f2−f2r) and (f3−f3r).

Further, FIG. 10 represents a rate of change of the frequency at each temperature shown in FIG. 9 with respect to the frequency at the reference temperature (25° C.). Therefore, values on a vertical axis in FIG. 10 represent (f1−f1r)/f1r, (f2−f2r)/f2r and (f3−f3r)/f3r, and these values are set to be represented by OSC1, OSC2 and OSC3, respectively. Note that a unit of the value on the vertical axis in FIG. 10 is ppm.

Here, returning to the explanation of the frequency difference detecting unit 4, the frequency difference detecting unit 4 in this embodiment sets, not the value of (f2−f2re)−(f1/3−f1re/3)=f2−f1/3−Δfr itself, but $\{(f2-f1/3)/(f1/3)\}-\{(f2re-f1re/3)/(f1re/3)\}$, to a calculated value, as described above. Further, a characteristic curve indicating a relation between a digital value representing the calculated value by the 34-bit value and the temperature, becomes substantially the same as a characteristic curve indicating a relation between OSC2−OSC1 and the temperature. Therefore, it can be said that the frequency difference detecting unit 4 performs calculation for determining OSC2−OSC1. Specifically, the frequency difference detecting unit 4 determines, regarding a value of ratio indicating that each frequency is deviated from the frequency at the reference temperature at how much ratio, a difference between the ratio in f2 and the ratio in f1. The frequency signal corresponding to (f2−f1/3) is input into the latch circuit 43, but, the saw-tooth wave is input into the PLL loop, so that it is possible to configure the circuit to conduct such calculation. If the output of the frequency difference detecting unit 4 is the 34-bit digital value, a value of 0.058 (ppb) per 1 bit is assigned, for example, and the value of OSC2−OSC1 achieves an accuracy as much as 0.058 (ppb). Note that grounds why it is possible to set the value of 0.058 (ppb) per 1 bit are based on later-described expressions (2) to (4).

Figure 11:
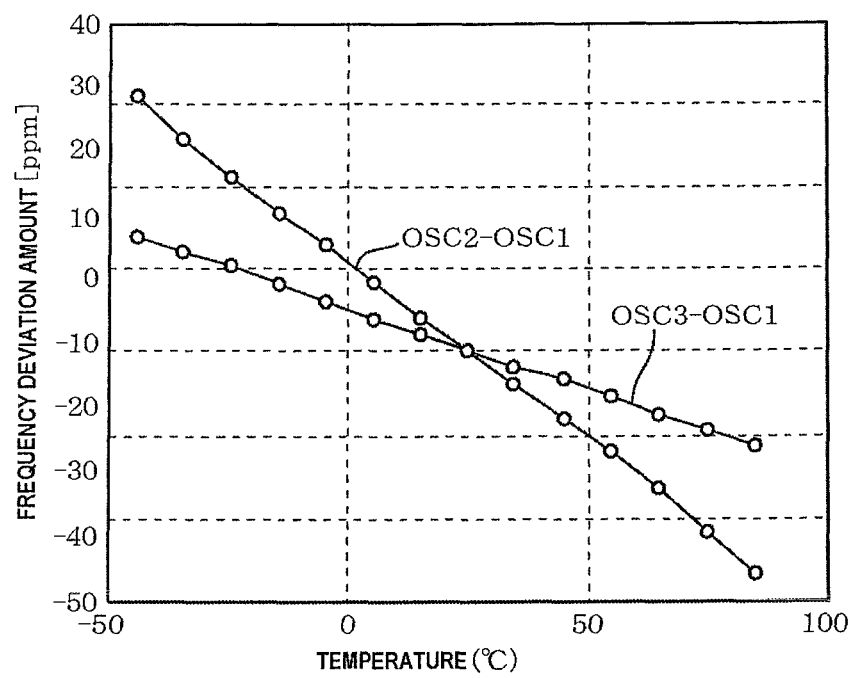
FIG. 11 is a frequency-temperature characteristic diagram showing relations between differences of the values as a result of normalizing the respective frequencies and the temperature.
Figure 12:
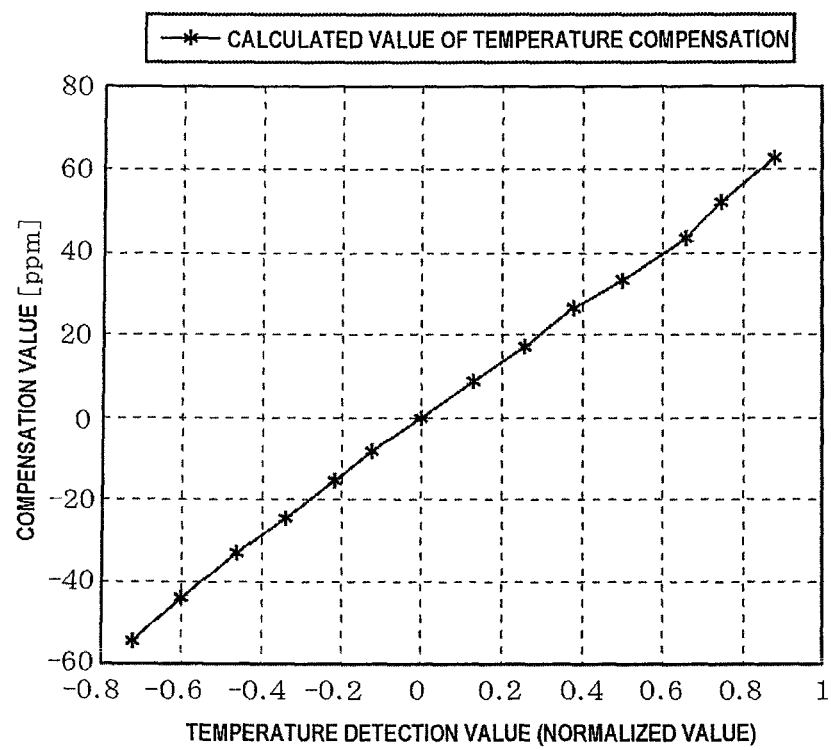
FIG. 12 is a characteristic diagram showing a relation between an amount of variation due to a temperature change included in a value corresponding to f1/3−f3 and a value corresponding to a temperature detection result.

FIG. 11 represents a relation between (OSC2−OSC1) and the temperature, and a relation between (OSC3−OSC1) and the temperature. (OSC2−OSC1) exhibits nonlinearity with respect to the temperature, in other words, it exhibits poor linearity, but, (OSC3−OSC1) exhibits good linearity with respect to the temperature. The reason thereof is that both of f3 and f1 are overtones, and the applicant understands that the difference between f3 and f1 and the temperature are in a good proportional relation. For this reason, (OSC3−OSC1) is used as the temperature detection value. In FIG. 12, the value of (OSC3−OSC1) being the temperature detection value is taken on a horizontal axis, and the value of (OSC2−OSC1) is taken on a vertical axis. Note that, more specifically speaking, the value as a result of normalizing the temperature detection value is taken on the horizontal axis, in order to suppress the number of bits of the temperature detection value. For example, an upper limit temperature and a lower limit temperature under which the oscillation device will be actually used are previously set, and a value of (OSC3−OSC1) at the upper limit temperature is treated as +1, and a value of (OSC3−OSC1) at the lower limit temperature is treated as −1.

In this example, a graph in FIG. 12 is regarded as a curve, and coefficients of the ninth-order polynomial approximate expression are derived through a least square method. Further, the coefficients of the polynomial approximate expression are previously stored in a memory included in the temperature variation amount calculating unit 7, and the temperature variation amount calculating unit 7 performs calculation processing of an expression (2) by using these coefficients of the polynomial approximate expression.

$$Y = P1 \cdot X^9 + P2 \cdot X^8 + P3 \cdot X^7 + P4 \cdot X^6 + P5 \cdot X^5 + P6 \cdot X^4 + P7 \cdot X^3 + P8 \cdot X^2 + P9 \cdot X \quad (2)$$

In the expression (2), X indicates frequency difference detection information, Y indicates compensation data, and P1 to P9 indicate the coefficients of the polynomial approximate expression.

Here, X is the value obtained by the frequency difference detecting unit 5 shown in FIG. 2, namely, the value (OSC3-OSC1) obtained by the averaging circuit 57 shown in FIG. 4.

Figure 13:
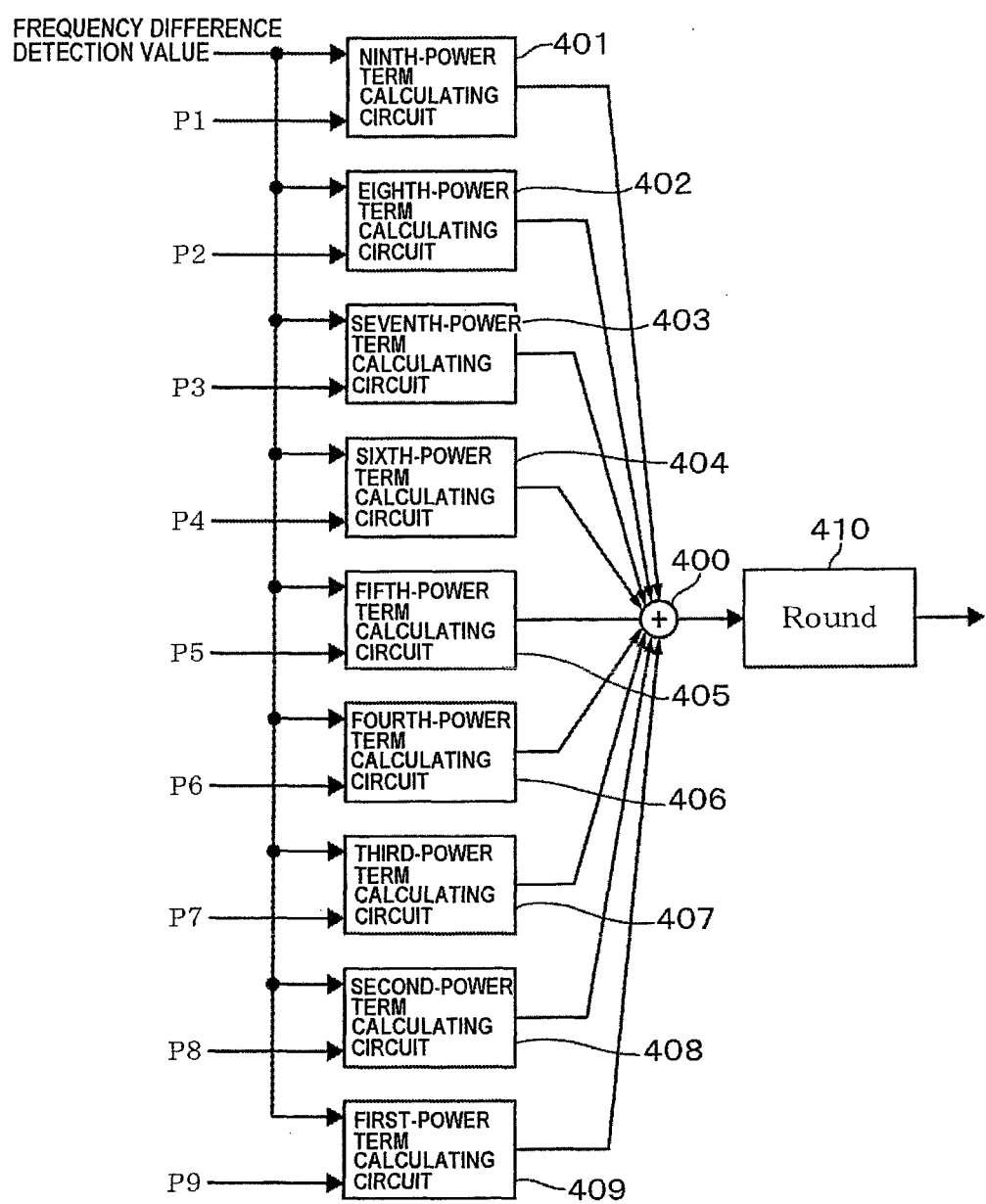
FIG. 13 is a block diagram showing calculating sections for determining, through calculation, a value on a vertical axis based on a value on a horizontal axis of the characteristic diagram shown in FIG. 12.

An example of block diagram for executing the calculation in the temperature variation amount calculating unit 7 is shown in FIG. 13. In FIG. 13, 401 to 409 denote calculating sections that perform the calculation of respective terms in the expression (2), 400 denotes an adding section, and 410 denotes a circuit that performs round processing. Note that it is also possible to structure the temperature variation amount calculating unit 7 such that, for example, one multiplying section is used, a value of ninth-power term is determined in the multiplying section, and a value of eighth-power term is subsequently determined in the multiplying section, namely, the multiplying section is used in a sort of repeated manner, and values of respective power terms are finally added. Further, the arithmetic expression of the compensation value is not limited to the use of the ninth-order polynomial approximate expression, and it is also possible to use an approximate expression of an order in accordance with a required accuracy.

Figure 14:
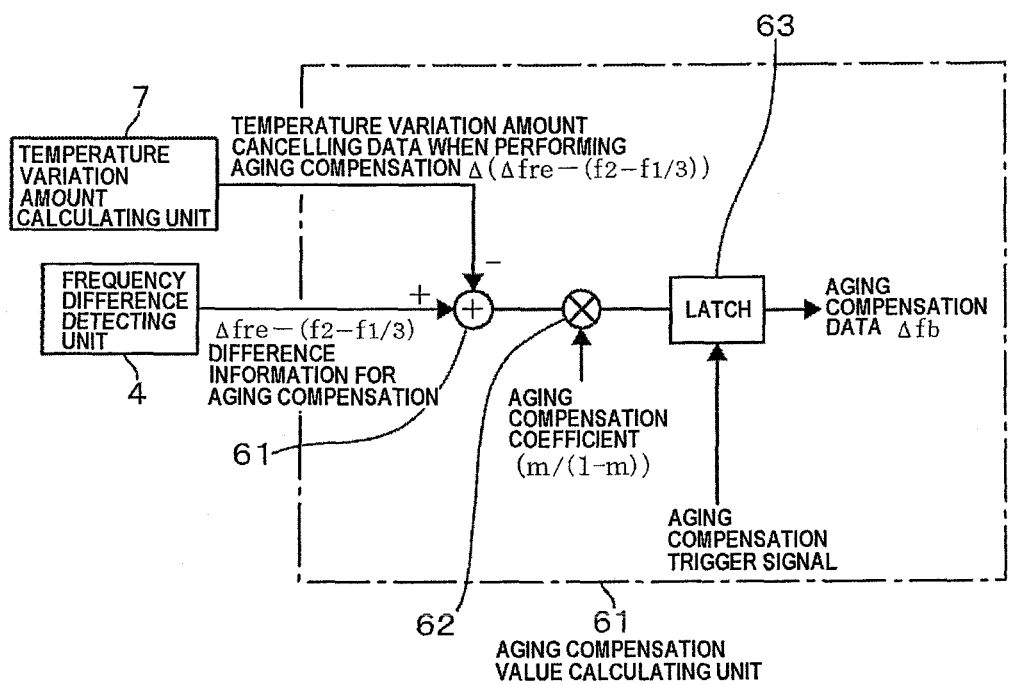
FIG. 14 is a block diagram showing an aging compensation value calculating unit.

The frequency difference information obtained by the frequency difference detecting unit 4 and the information obtained by the temperature variation amount calculating unit 7 as above are input into the aging compensation value calculating unit 6 shown in FIG. 2. FIG. 14 is a diagram showing details of the aging compensation value calculating unit 6, in which 61 denotes an adding section. The information obtained by the temperature variation amount calculating unit 7 corresponds to the value of the temperature variation amount included in $\Delta F = \Delta fre - (f2 - f1/3)$ being the frequency difference information for aging compensation determined by the frequency difference detecting unit 4 as described above, so that it can be said that it is temperature variation amount cancelling data when performing aging compensation. The adding section 61 subtracts the cancelling data from $\Delta F$, to thereby determine true $\Delta F$ based on the aging (aging characteristic) caused by driving the quartz-crystal oscillator, shown in the aforementioned FIG. 1(b).

Figure 15:
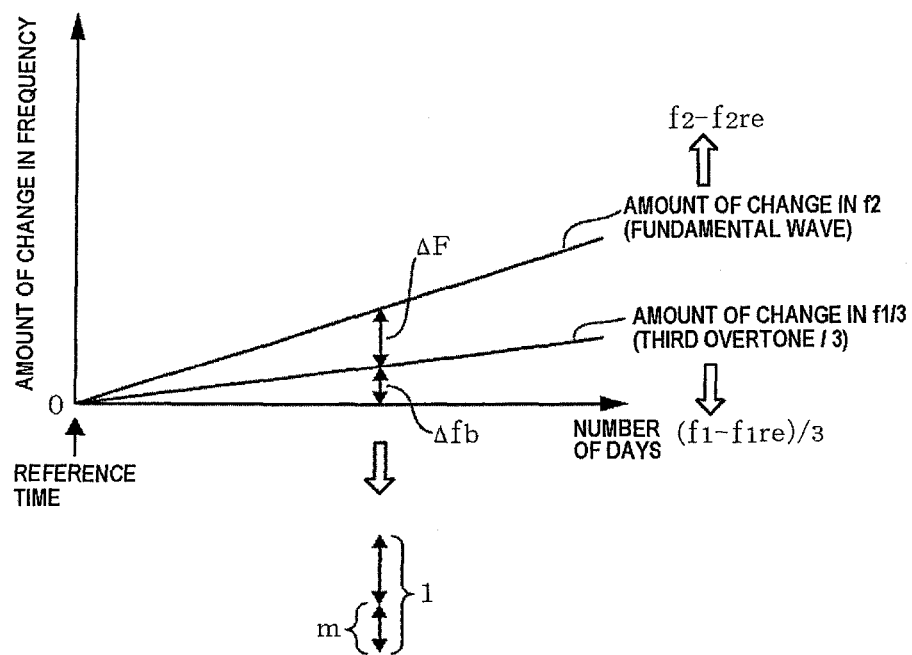
FIG. 15 is a characteristic diagram showing a state where frequencies change due to aging (change over time)

FIG. 15 is a diagram corresponding to FIG. 1(b), and as described by citing the expression (1) in the outline of the embodiment of the invention, if $\Delta F$ becomes known, it is possible to determine $\Delta fb = (f1 - f1re)/3$ by using is the previously determined ratio m of $(f1 - f1re)/3$ with respect to $(f2 - f2re)$. A part that performs this calculation is a multiplying section 62 shown in FIG. 14. Further, at a subsequent stage of the multiplying section 62, a latch circuit section 63 is provided, and $\Delta fb$ is latched based on an aging compensation trigger signal to be output from the aging compensation value calculating unit 6. The trigger signal is transmitted from a not-shown control unit that controls the oscillation device, and it is designed such that an operator can select whether the trigger signal is output or not.

The above explanation is about a method of determining the amount of variation in frequency due to the aging regarding f1 being the clock supplied to the control circuit unit 200 of the oscillation device, but, when the present invention is not applied to the OCXO, it is preferable to compensate for a temperature variation amount of f1 as well. In order to achieve that, there is a need to detect a temperature using a temperature detecting unit, determine temperature compensation data $\Delta fa$ being the temperature variation amount of f1 based on a relation between a temperature detection value and f1, specifically, based on a relation between a temperature normalized with respect to the reference temperature and an amount of change in frequency with respect to a frequency at the reference temperature, and to add $\Delta fa$ to the above-described $\Delta fb$. A part denoted by a reference numeral 9 in FIG. 2 is an adding unit that performs this calculation.

In this embodiment, a part formed of the first quartz-crystal oscillator 10 used as a clock, the first oscillation circuit 1, the third quartz-crystal oscillator 30, the third oscillation circuit 3, the frequency difference detecting unit 5 and a temperature compensation value calculating unit 8, is used as the temperature detecting unit. An operation up to the determination of $\Delta F' = f3 - f1 - \Delta frt$ corresponding to the temperature detection value being an output of the frequency difference detecting unit 5, is the same as the calculation operation of the temperature compensation data $\Delta fa$ described above, but, there is a difference in that the temperature variation amount of f1 is determined by using $\Delta F'$ in the temperature compensation value calculating unit 8.

Figure 16:
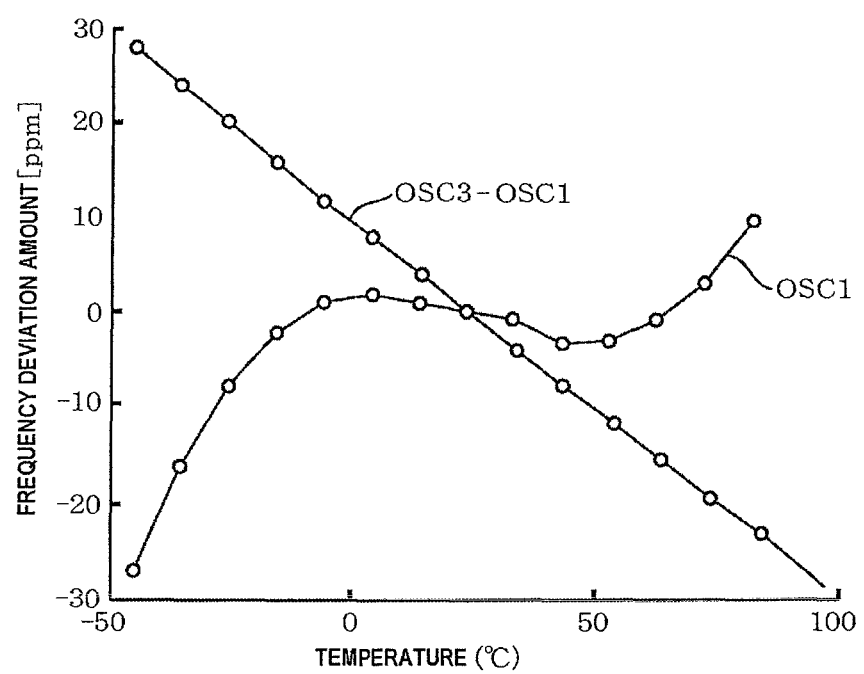
FIG. 16 is a frequency-temperature characteristic diagram showing a relation between the value of normalized f1 and the temperature and a relation between a difference between the value of normalized f1 and the value of normalized f2 and the temperature.
Figure 17:
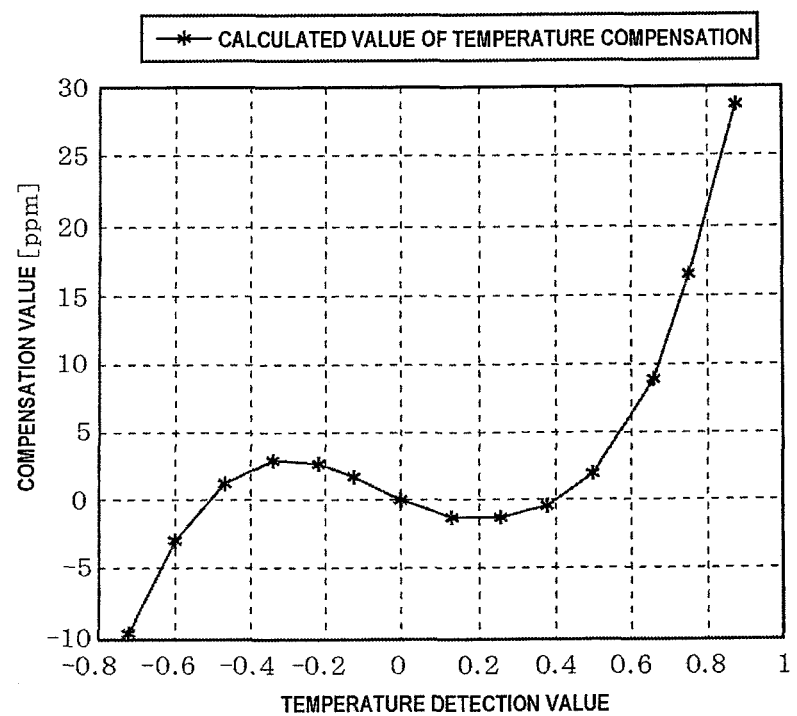
FIG. 17 is a characteristic diagram showing a relation between a value obtained by normalizing a vertical axis in FIG. 16 and a frequency compensation value.

FIG. 16 shows a relation between (OSC3-OSC1) and the temperature, and a relation between OSC1 and the temperature, and in FIG. 17, the value of (OSC3-OSC1) being the temperature detection value is taken on a horizontal axis, and a value of —OSC1 is taken on a vertical axis, based on FIG. 16. Note that, more specifically, a value as a result of normalizing the temperature detection value is taken on the horizontal axis, as described above. In this example, coefficients of ninth-order polynomial approximate expression are derived through a least square method with respect to the graph in FIG. 17. Further, the coefficients of the polynomial approximate expression are previously stored in a memory included in the temperature compensation value calculating unit, and the temperature compensation value calculating unit 8 performs calculation processing by using these coefficients of the polynomial approximate expression. Note that the calculation processing is conducted by using the expression (2) after changing the coefficients, for example.

The temperature compensation data $\Delta fa$ and the aging compensation data $\Delta fb$ obtained as above are added in the adding unit 9 (refer to FIG. 2), to thereby obtain a compensation value. The DDS circuit section 201 shown in FIG. 3 outputs a reference clock signal by using the frequency signal f1 output from the first oscillation circuit 1 as an operating clock, and a frequency of the reference clock signal varies due to the aging and the temperature change in the frequency signal f1. Meanwhile, frequency data formed of a digital value corresponding to a set value for setting an output frequency of the voltage controlled oscillator 100 is input into the control circuit unit 200 shown in FIG. 2, and the frequency data is compensated by the compensation value obtained from the adding unit 9. Concretely, the compensation value and the frequency data are added by the adding unit 90 provided at a subsequent stage of the adding unit 9, and the added value is input into the DDS circuit section 201, for example. By performing compensation of the frequency data as above, the operating clock f1 for the DDS circuit section 201 corresponding to the amount of aging and the amount of temperature change is compensated. As a result of this, the output frequency of the voltage controlled oscillator 100 being the output of the oscillation device 1 of the present embodiment becomes stable regardless of the frequency variation based on the aging and the frequency variation based on the temperature change in the quartz-crystal oscillator. Therefore, it is possible to realize an oscillation device with high stability and high accuracy. Note that external compensation data input into the adding unit 9 in FIG. 2 is treated as a modified example of the present embodiment, so that it will be described later.

In this embodiment, as shown in FIG. 2, the first to third quartz-crystal oscillators 10 to 30 are structured by using the common quartz-crystal piece Xb, and are thermally coupled to one another, so that the frequency difference among the oscillation circuits 1 to 3 takes a value which corresponds to the ambient temperature quite accurately, and accordingly, it is possible to perform the aforementioned temperature compensation and aging compensation with high accuracy. Note that it is also possible to structure such that the first to third quartz-crystal oscillators 10 to 30 are structured by using separate quartz-crystal pieces, and these are disposed in a common container, to thereby provide the same ambient temperature.

Further, in this embodiment, it is set such that the output frequency of the first oscillation circuit is compensated by using a difference between the fundamental wave and the overtone, by utilizing the fact that the aging in the fundamental wave of the quartz-crystal oscillator is greater than that in the overtone. Further, by utilizing the fact that the amount of variation in the overtone is large with respect to the temperature change, and a difference of characteristics of mutual overtones is large due to the temperature change, the overtone is used in the temperature compensation. For this reason, there is an advantage that the frequency compensation corresponding to the aging and the temperature change in the quartz-crystal oscillator can be conducted with high accuracy.

Further, in order to obtain the frequency difference information, the PLL is structured such that, for example, the pulse of difference frequency between f2 and f1/3 is created, the saw-tooth wave signal output from the DDS circuit section 46 is latched by the latch circuit 43 based on the pulse, the value of the latched signal is integrated, the integral value is output as the frequency difference, and the difference between the output and the value corresponding to the difference between f2r and f1r/3 is obtained to be input into the DDS circuit section 46. When counting a frequency difference and obtaining the difference, the count time directly influences on the detection accuracy, but, with the structure as described above, there is no such problem, and thus there is an advantage that a detection accuracy is high. The output signal of the DDS circuit section 46 of the frequency difference detecting unit 4 is not limited to the saw-tooth wave, and it is only required to be a frequency signal whose signal value repeatedly increases and decreases with time such as, for example, a sine wave. Note that for determining the frequency difference, it is also possible to apply a method in which a frequency counting circuit is prepared, and a difference of respective count values is determined.

Further, it is also possible to design that the second quartz-crystal oscillator 20 is selectively connected to one of the second oscillation circuit 2 and the third oscillation circuit 3. As an example case, it is considerable to integrate the second oscillation circuit 2 and the third oscillation circuit 3, with a part of the integrated circuit selectable between a circuit element for the fundamental wave and a circuit element for the third overtone. In this case, a step that the second quartz-crystal oscillator 20 is connected to the second oscillation circuit 2, is to use the circuit element for the fundamental wave, and a step that the second quartz-crystal oscillator 20 is connected to the third oscillation circuit 3, is to use the circuit element for the third overtone.

In such cases, as a basis, the second quartz-crystal oscillator 20 is connected to the third oscillation circuit 3, and the output from the temperature compensation value-calculating unit 8 execute the temperature compensation for f1. Periodically, for example once a month or twice a year, the state that the second quartz-crystal oscillator 20 is connected to the second oscillation circuit 2, is selected. When the second quartz-crystal oscillator 20 is not connected to the third oscillation circuit 3, the temperature compensation data Dfa, just prior to switch the connection of the second quartz-crystal oscillator 20 to the second oscillation circuit 2, from the third oscillation circuit 3, is output from the temperature compensation value calculating unit 8. Further, when the second quartz-crystal oscillator 20 does not select the connection to the second oscillation circuit 2, the aging compensation data Dfb, just prior to switch the connection of the second quartz-crystal oscillator 20 to the third oscillation circuit 3, from the second oscillation circuit 2, is output from the aging compensation value calculating unit 6. Therefore, in this case, the aging compensation data Dfb is chronically updated.

Further, it is considerable to design a selective switch unit between the second quartz-crystal oscillator 20 and both of the second oscillation circuit 2 and the third oscillation circuit 3.

Although the description is repeated, in this embodiment, the value corresponding to the difference between f2 and f2$re$ is $\{(f2-f2re)/f2re\}$ (=OSC2), the value corresponding to the difference between f1/3 and f1$re$/3 is $\{(f1-f1re)/f1re\}$ (=OSC1), and the value corresponding to the difference value between these values is OSC2−OSC1. However, it is of course possible that, from the explanation of FIG. 1, the frequency difference detecting unit 4 uses the difference value between f2−f2$re$ and f1/3−f1$re$/3 itself, as the value corresponding to the difference value between the value corresponding to the difference between f2 and f2$re$ and the value corresponding to the difference between f1/3 and f1$re$/3.

In the aforementioned embodiment, in the explanation from FIG. 10 to FIG. 12, the amount of variation in the frequency is displayed in the unit of "ppm", but, it is all treated as a binary number in an actual digital circuit, so that a frequency setting accuracy of the DDS circuit section 46 is calculated by the number of configuration bits, for example, 34 bits. There can be cited an example as follows, in which a clock of 10 MHz is supplied to the DDS circuit section 201 included in the control circuit unit 200 shown in FIG. 2, a variable frequency of the clock being 100 Hz.

[Variable Ratio Calculation]

$$100 \text{ Hz}/10 \text{ MHz}=0.00001$$

[ppm Conversion]

$$0.00001*1e6=10 \text{ [ppm]}$$

[DDS Setting Accuracy Conversion]

$$0.00001*2^{34} \approx 171.799 \text{ [ratio-34 bit (tentative name)]}$$

In the above-described structure, the frequency setting accuracy can be represented by the following expression (2).

$$1 \times [\text{ratio-34 bit}]=10 \text{ M [Hz]}/2^{34} \approx 0.58 \text{ m [Hz/bit]} \quad (2)$$

Therefore, the expression of 100 [Hz]/0.58 m [Hz/bit] ≈171.799 [bit (ratio-34 bit)] is satisfied.

Further, 0.58 mHz can be calculated with respect to 10 MHz as the following expression (3).

$$0.58 \text{ m [Hz]}/10 \text{ M [Hz]}*1e9 \approx 0.058 \text{ [ppb]} \quad (3)$$

Therefore, from the expressions (2), (3), a relation of expression (4) is satisfied.

$$1e9/2^{34}=0.058 \text{ [ppb/ratio-34 bit]} \quad (4)$$

Specifically, the frequency processed in the DDS circuit section 46 is eliminated, and a relation with only the number of bits is satisfied.

Furthermore, in the aforementioned example, the first quartz-crystal oscillator 10 and the second quartz-crystal oscillator 20 use the common quartz-crystal piece Xb, but, it is also possible that the quartz-crystal piece Xb is not used in a shared manner. In this case, there can be cited an example in which the first quartz-crystal oscillator 10 and the second quartz-crystal oscillator 20 are disposed in a common casing, for example. Further, although the signal of overtone from the second quartz-crystal oscillator 20 is utilized for the temperature compensation, it is also possible to structure such that a third quartz-crystal oscillator is provided separately from the first quartz-crystal oscillator 10 and the second quartz-crystal oscillator 20, and a frequency signal f3 for temperature compensation is obtained from the third quartz-crystal oscillator.

The compensation value obtained by the adding unit 9 is not limited to be used as in the aforementioned embodiment, and it is also possible to perform compensation with another method as long as the method is structured to be able to perform, when the output frequency of the oscillation device varies due to the aging and the temperature, compensation so as to be able to cancel the amount of variation in the output frequency by using the compensation value.

The present invention is made on the premise that the output of the oscillation device is generated by utilizing the output of the first oscillation circuit 1, and as an example of the present invention, in the aforementioned embodiment, the frequency signal f1 obtained from the first oscillation circuit 1 is used as the reference clock of the control circuit unit 200 (specifically, the DDS circuit section 201) shown in FIG. 2. However, as an example in which the output of the oscillation device is generated by utilizing the output of the first oscillation circuit 1, it is also possible to adopt an example in which the output of the first oscillation circuit 1 is used as it is, as the output of the oscillation device, as in the general TCXO. There is a device, as one of TCXO, in which a reference voltage corresponding to a frequency of a quartz-crystal oscillator at the reference temperature is generated, and a compensation voltage in accordance with a temperature value detected by a temperature detector is added to the reference voltage, and as the compensation voltage in this case, the compensation value obtained by the adding unit 9 may also be used.

In the above description, the "external compensation data" input into the adding unit 9 in FIG. 2 will be described. A frequency stability of a clock used in a femto cell base station and the like is required to have a quite high stability of ±30 ppb or less. Therefore, by using a circuit unit such as a PLL that compares a clock signal with high accuracy and high stability obtained from a GPS receiver, an NTP server or the like with the frequency signal output from the oscillation device of the present invention, and obtains a phase difference between the both signals, for example, a compensation value corresponding to the difference is determined, and the compensation value is input into the adding unit 9 as the "external compensation data". Therefore, the compensation data output from the adding unit 9 is an added value of the aforementioned temperature compensation data Δfa, aging compensation data Δfb and the external compensation data.

If described more concretely, the circuit unit has a function of determining the value corresponding to the phase difference between the both signals, and then replacing, in a relation between the control voltage input into the control circuit unit 200 in FIG. 2 and a rate of change of frequency output from the VCXO 100, the value with a compensation amount of control voltage in accordance with a compensation amount of the rate of change of frequency. The compensation amount of the control voltage corresponds to the external compensation data.

With the structure as above, the frequency signal obtained from the oscillation device becomes one with higher accuracy and higher stability. Further, if such usage is applied, it is possible to generate a highly accurate and highly stable clock while using an oscillation device with sort of low is stability such as a TCXO, and it is possible to apply the oscillation device to a system in which high requirements are placed on a clock in the femto cell base station and the like. Further, according to the present invention, even in a case where a high-quality clock from the outside, namely, from the NTP server or the like, for example, is stopped, by constantly storing clock data in a memory in a cyclic manner over a certain period of time in a higher device of the oscillation device and reading the clock data immediately before the clock is stopped from the memory, it is possible to perform similar compensation based on the external compensation data, and at the same time, the temperature compensation and the aging compensation are conducted. Therefore, it is possible to maintain a certain level of accuracy regarding the output of the oscillation device, and to avoid a system down from occurring.

What is claimed is:

1. An oscillation device using quartz-crystal oscillators, comprising:
   a first quartz-crystal oscillator structured by providing first electrodes on a quartz-crystal piece;
   a second quartz-crystal oscillator structured by providing second electrodes on a quart-crystal piece;
   a first oscillation circuit and a second oscillation circuit connected to said first quartz-crystal oscillator and said second quartz-crystal oscillator, respectively;
   a frequency difference detecting unit determining, when an oscillation frequency of said first oscillation circuit is set to f1, an oscillation frequency of said first oscillation circuit at a reference time is set to f1$rz$, an oscillation frequency of said second oscillation circuit is set to f2, and an oscillation frequency of said second oscillation circuit at the reference time is set to f2$rz$, a value corresponding to a difference value ΔF between a value corresponding to a difference between f2 and f2$rz$, and a value corresponding to a difference between f1 and f1$rz$; and
   a compensation value obtaining unit for aging compensation obtaining a frequency compensation value of f1 based on an elapse of time from the reference time, based on the value corresponding to the difference value ΔF detected by said frequency difference detecting unit, and a compensation coefficient of aging, wherein:
   the compensation coefficient of aging is a ratio between an amount of change in the frequency of said first oscillation circuit and an amount of change in the frequency of said second oscillation circuit with respect to an elapse of operating time from the reference time;
   an output of said oscillation device is structured to be generated by utilizing an output of said first oscillation circuit; and
   a set value of the output frequency is structured to be compensated based on the frequency compensation value determined by said compensation value obtaining unit.

2. The oscillation device according to claim 1, wherein:

the oscillation frequency f1 of said first oscillation circuit is an n-th overtone, and the oscillation frequency f2 of said second oscillation circuit is a frequency of fundamental wave; and the difference value $\Delta F$ is $\{(f2-f2rz)/f2rz\}-\{(f1-f1rz)/f1rz\}$.

3. The oscillation device according to claim 1, wherein:

the compensation coefficient of aging is a value set at a reference temperature;

said oscillation device further comprising:

a temperature detecting unit detecting an atmospheric temperature under which said first quartz-crystal oscillator and said second quartz-crystal oscillator are placed; and a calculating unit for temperature compensation determining, based on a relation between an amount of temperature change from the reference temperature and an amount of variation with respect to the difference value $\Delta F$ at the reference temperature, and the atmospheric temperature determined by said temperature detecting unit, an amount of change due to the temperature change included in the difference value $\Delta F$ at the reference time; and said compensation value obtaining unit obtains the frequency compensation value of f1 by using a value obtained by subtracting the amount of change calculated by said calculating unit for temperature compensation from the difference value $\Delta F$.

4. The oscillation device according to claim 1, further comprising:

a temperature detecting unit detecting an atmospheric temperature under which said first quartz-crystal oscillator and said second quartz-crystal oscillator are placed; and a compensation value obtaining unit for temperature compensation obtaining, based on a signal corresponding to the temperature detected by said temperature detecting unit, and a relation between the signal and a frequency compensation value of the oscillation frequency f1 of said first oscillation circuit, the frequency compensation value of f1 because the ambient temperature is deviated from the reference temperature, wherein a set value of the output frequency is structured to be compensated based on the frequency compensation value determined by said compensation value obtaining unit for aging compensation, and the frequency compensation value determined by said compensation value obtaining unit for temperature compensation.

5. The oscillation device according to claim 1, wherein said frequency difference detecting unit comprises: a pulse creating section creating a pulse of difference frequency between the f1 and f2; a DDS circuit section outputting a frequency signal whose signal value repeatedly increases and decreases with time by a frequency in accordance with a magnitude of an input direct-current voltage; a latch circuit latching, based on the pulse created by the pulse creating section, the frequency signal output from the DDS circuit section; a loop filter integrating a value of the signal latched by the latch circuit and outputting the integral value as a value corresponding to the difference value; and an adding section obtaining a difference between the output of the loop filter and a value corresponding to a difference between f1rz and f2rz to set it as an input value to be input into the DDS circuit section.

6. The oscillation device according to claim 1, wherein the quartz-crystal piece of said first quartz-crystal oscillator and the quartz-crystal piece of said second quartz-crystal oscillator are made common.

* * * * *